(12) United States Patent
Kalkur et al.

(10) Patent No.: US 7,355,542 B2
(45) Date of Patent: Apr. 8, 2008

(54) POLARIZATION SWITCHING DIGITAL TO ANALOG CONVERTER AND METHOD

(75) Inventors: Thottam Subramanya Kalkur, Colorado Springs, CO (US); Shunming Sun, Colorado Springs, CO (US)

(73) Assignee: Regents of the University of Colorado, Boulder, CO (US)

( * ) Notice: Subject to any disclaimer, the term of this patent is extended or adjusted under 35 U.S.C. 154(b) by 37 days.

(21) Appl. No.: 11/365,189

(22) Filed: Mar. 1, 2006

(65) Prior Publication Data
US 2006/0203534 A1 Sep. 14, 2006

Related U.S. Application Data

(60) Provisional application No. 60/658,758, filed on Mar. 4, 2005.

(51) Int. Cl.
*H03M 1/66* (2006.01)
(52) U.S. Cl. .................................................. 341/150
(58) Field of Classification Search ................ 341/150, 341/144
See application file for complete search history.

(56) References Cited

U.S. PATENT DOCUMENTS 6,801,149 B2 * 10/2004 Walton et al. ............... 341/150
6,995,998 B2 * 2/2006 Kang ......................... 365/145

* cited by examiner

*Primary Examiner*—Brian Young
(74) *Attorney, Agent, or Firm*—Dale B. Halling

(57) ABSTRACT

A polarization switching digital to analog converter has a ferroelectric capacitor. A number of switches are coupled to the ferroelectric capacitor. A summing circuit is coupled to the one of the switches.

22 Claims, 5 Drawing Sheets

POLARIZATION SWITCHING DIGITAL TO ANALOG CONVERTER AND METHOD

RELATED APPLICATIONS

The present invention claims priority on provisional patent application, Ser. No. 60/658,758, filed on Mar. 4, 2005, entitled "Polarization Switching D/A Converter" and is hereby incorporated by reference.

FIELD OF THE INVENTION

The present invention relates generally to the field of electronic circuits and more particularly to a polarization switching analog to digital converter and method.

BACKGROUND OF THE INVENTION

Digital to analog (D/A) conversion normally is realized through the division of a reference voltage, steering of binary- or equal-weighted currents, redistribution of a programmable charge, or a hybrid of the above approaches. These D/A conversion techniques utilize voltage, current and charge as the conversion media, and employ resistors, current mirrors and capacitors as the conversion components. The performance of a D/A converter (DAC) is affected by the precision of the voltage-division resistor network, steering current sources and/or programmable capacitor array, where the resistors and capacitors must be linear circuit components. Unfortunately, present digital to analog converters require a significant amount of die space and are significant current draws.

Thus there exists a need for a digital to analog converter that does not require a significant amount of die space and does not draw significant current.

SUMMARY OF INVENTION

A polarization switching digital to analog converter that overcomes these and other problems has a ferroelectric capacitor. A number of switches are coupled to the ferroelectric capacitor. A summing circuit is coupled to the one of the switches. The converter may include a number of ferroelectric capacitors, each of the capacitors forming a leg of the digital to analog converter. The switches may include a first switch connecting a first terminal of the ferroelectric capacitor to the summing network and a second switch connecting a second terminal of the ferroelectric capacitor to the summing network. The switches may include a subset of switches connecting the first terminal to a positive voltage source and a negative voltage source. The switches may include a second subset of switches connecting the second terminal to the positive voltage source and the negative voltage source. The ferroelectric capacitor may be operated in a non-linear region. The summing circuit may have a feedback capacitor and the feedback capacitor may be a linear capacitor.

In one embodiment, a method of operating a polarization switching digital to analog converter includes the steps of applying a reset signal to a number of non-linear capacitors. A digital number is applied to a number of switches coupled to the non-linear capacitors. A current from the capacitors is summed. An initial polarization may be set for each of the non-linear capacitors. The initial polarization of each of the non-linear capacitors may be set to the same polarization. Each of the non-linear capacitors may be selected based on a switching current and a displacement current. As part of the conversion it is determined for each non-linear capacitor if a one or a zero is to be represented. When a one is to be represented a polarity of an associated non-linear capacitor is reversed. The non-linear capacitors may be ferroelectric capacitors. An operating voltage is selected that results in the ferroelectric capacitors operating in a non-linear range.

In one embodiment, a polarization switching digital to analog converter has a number of non-linear capacitive legs. A summing circuit is coupled to an output of the non-linear capacitive legs. The non-linear capacitive legs may each contain a ferroelectric capacitor. The non-linear capacitive legs may have a pair of switches connecting each non-linear capacitor to the output of the non-linear capacitive legs. Each non-linear capacitor may be coupled to a positive power supply source by a pair of switches. Each non-linear capacitor may be coupled to a negative power supply source by a pair of switches. The summing circuit may include a linear capacitor.

DETAILED DESCRIPTION OF THE DRAWINGS

The present invention relates to a digital to analog (D/A) converter that uses less die space than conventional D/A converters and draws less current than conventional D/A converters. The polarization switching digital to analog converter achieves these advantages by using ferroelectric capacitors instead of standard capacitors. The higher dielectric constant of a ferroelectric capacitor allows the capacitors of the present invention to be much smaller than standard capacitors. This reduces the die space necessary to implement the present D/A converter. Since ferroelectric capacitors store charge, they do not draw as much current as standard capacitors.

Figure 2:
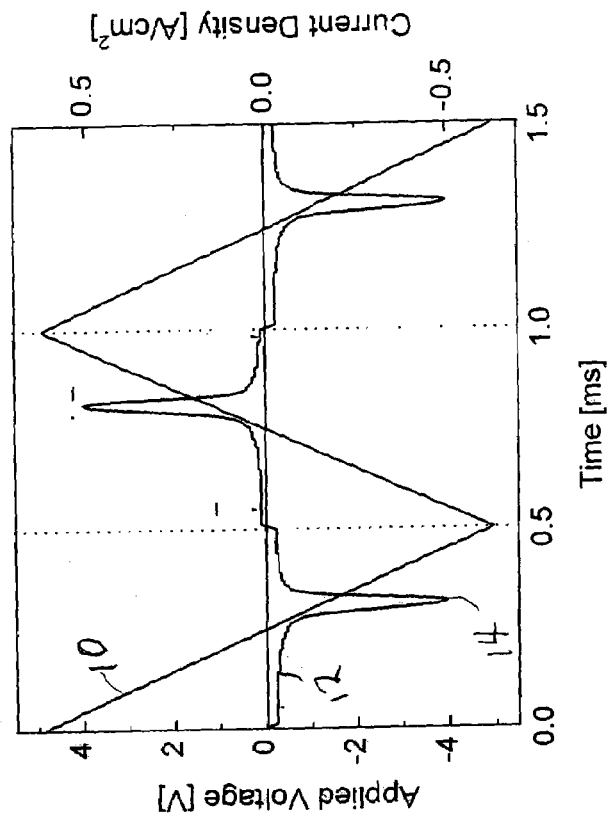
FIG. 2 is a graph of the applied voltage against time and the output current density versus time for a ferroelectric capacitor in accordance with one embodiment of the invention.
Figure 1:
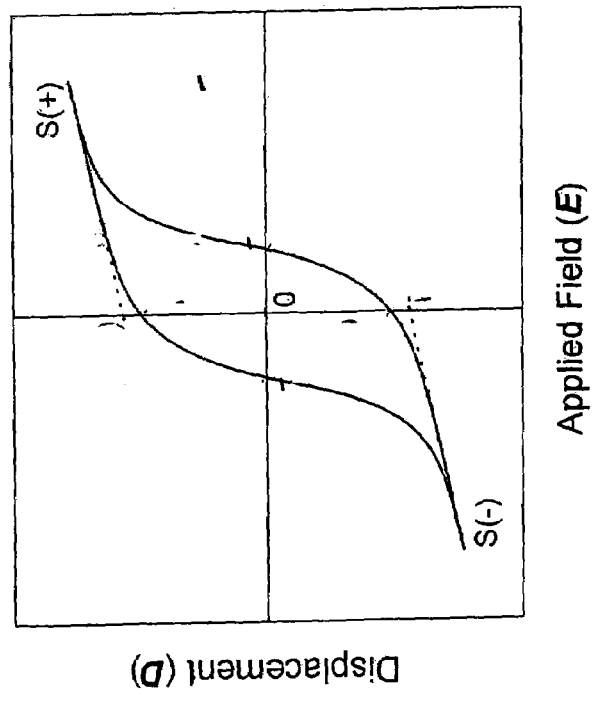
FIG. 1 is a graph of the applied field against the charge for a ferroelectric capacitor in accordance with one embodiment of the invention.

FIG. 1 is a graph of the applied field against the charge for a ferroelectric capacitor in accordance with one embodiment of the invention. The graph shows the charge or displacement (D) versus the applied electrical field or voltage. As can be seen by the graph, the ferroelectric capacitor has some hysteresis. As a result when a positive voltage is applied the charge on the capacitor is S(+). Once the voltage is removed the capacitor's charge does not go to zero. This is called the polarization charge. If the voltage is then changed to a negative voltage, the capacitor releases the polarization charge and then takes on a negative polarization charge S(−). The releasing of the polarization charge when the voltage is switched results in a switching current. This is shown in FIG. 2. FIG. 2 is a graph of the applied voltage against time and the output current density versus time for a ferroelectric capacitor in accordance with one embodiment of the invention. As the applied voltage 10 changes from 4.5 volts to a negative 4.5 volts the current density 12 output from the capacitor has a spike 14 as the voltage moves through zero volts. This occurs every time the voltage is changed from a positive peak to a negative peak. The total current out of a ferroelectric capacitor is the switching (polarization) current and the linear capacitive effect or displacement current, which is similar to a standard capacitor. The polarization or hysteresis is key to making a D/A converter that uses less space, since a ferroelectric capacitor has much higher dielectric constant that a standard capacitor.

Figure 3:
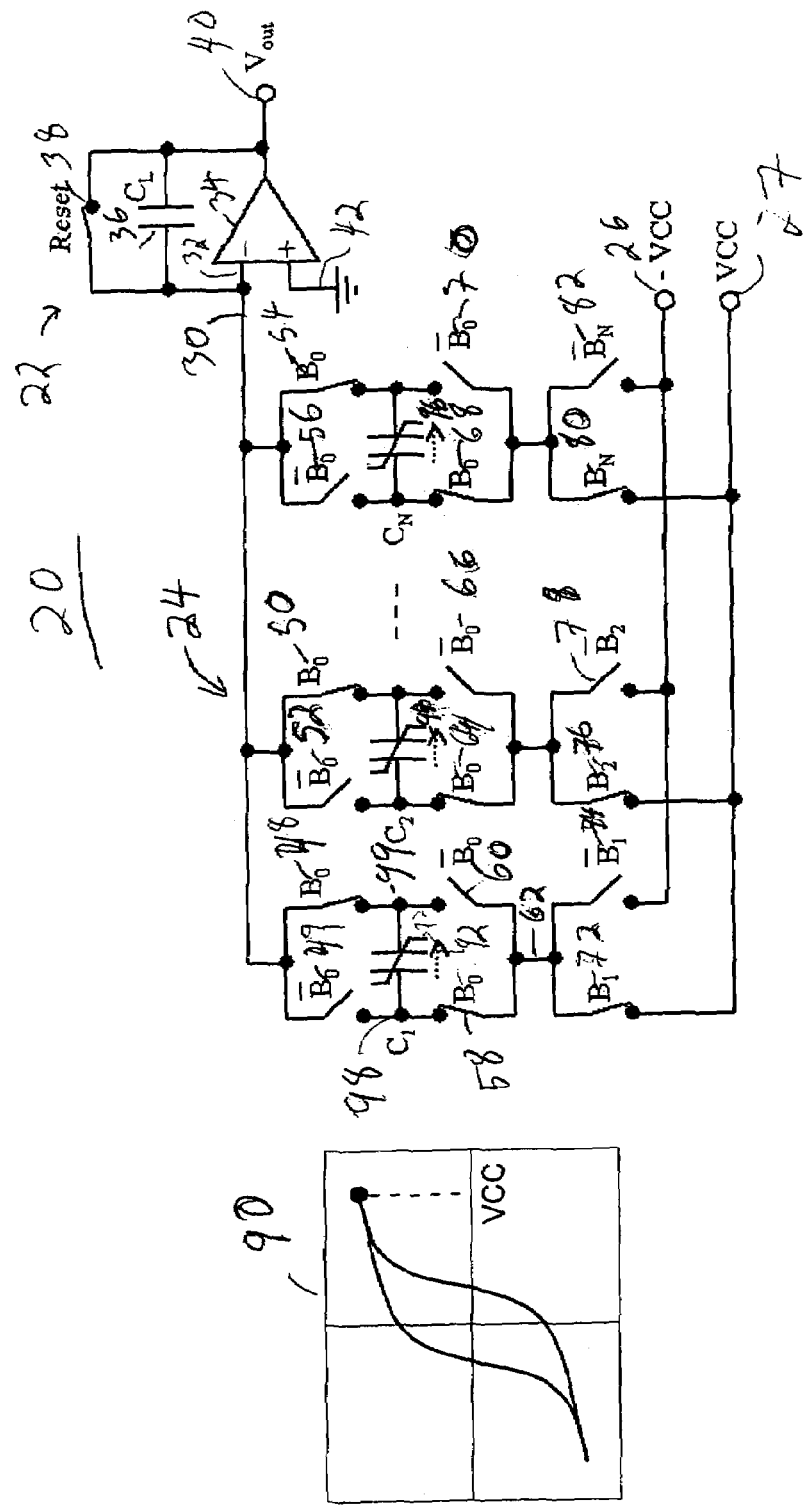
FIG. 3 is a circuit diagram of a polarization switching digital to analog converter in accordance with one embodiment of the invention.

FIG. 3 is a circuit diagram of a polarization switching digital to analog converter 20 in accordance with one embodiment of the invention. The converter 20 has a summing circuit 22 coupled to a plurality of capacitive legs 24 and a positive 26 and negative 27 voltage source coupled to the capacitive legs. The summing circuit has an input 30 coupled to the negative input 32 of an operational amplifier 34. The input 30 is also coupled to a linear feedback capacitor 36 and a reset switch 38. The output 40 of the converter 20 is the output of the operational amplifier 34. The output 40 is coupled to the reset switch 38 and the feedback capacitor 36. The positive input 42 of the operational amplifier 34 is coupled to ground.

The converter 20 is shown with n-capacitive legs each having a ferroelectric (or non-linear) capacitor C1, C2, Cn. A pair of output switches $B_0$ 48 and $B_0$ bar 49 are connected from the output 30 of the capacitive legs 24 to each terminal of the capacitor C1. A pair of output switches $B_0$ 50 and $B_0$ bar 52 are connected from the output 30 of the capacitive legs 24 to each terminal of the capacitor C2 and there are similar switches 54 & 56 for capacitor Cn. A second pair of switches 58, 60 couple the nodes of capacitor C1 to a power supply node 62. Note that switches $B_0$ are closed and opened together and similarly for $B_0$ bar. There a second pair switches 64, 66 and 68, 70 for capacitors C2 & Cn. A pair of power switches $B_1$ 72 and $B_1$ bar 74 are connected to the positive voltage source (+VCC) 27 and the negative voltage source (−VCC) 26 respectively. Another pair of power switches $B_2$ 76 and $B_2$ bar 78 connect the capacitor C2 to the positive voltage source (+VCC) 27 and the negative voltage source (−VCC) 26 respectively. Another pair of power switches $B_n$ 80 and $B_n$ bar 82 connect the capacitor Cn to the positive voltage source (+VCC) 27 and the negative voltage source (−VCC) 26 respectively.

As the converter 20 is shown in FIG. 3 it is in the reset state. The reset state in this embodiment, is designed to place all the capacitor C1, C2-Cn in the same polarization as shown in the graph 90. The polarization state is shown by arrows 92, 94, 96. Switches 72, 58 and 48 of the capacitive leg having capacitor C1 are closed. This places a positive voltage on node 98 of capacitor C1. Since the reset switch 38 is closed the voltage at the output 30 is grounded, which means the voltage at node 99 is ground. This places a positive voltage across the ferroelectric capacitors.

Figure 4:
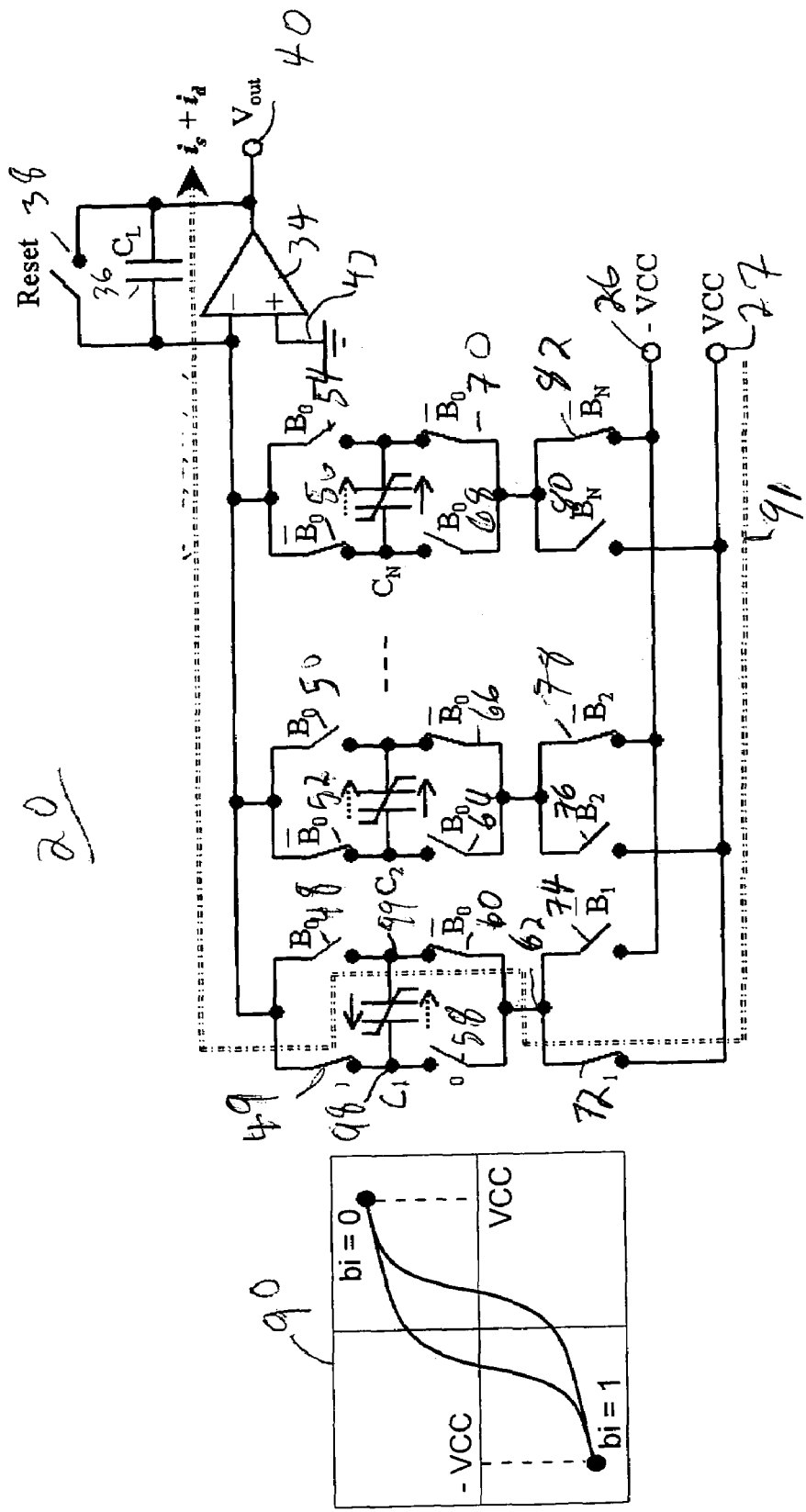
FIG. 4 is a circuit diagram of a polarization switching digital to analog converter in accordance with one embodiment of the invention.

FIG. 4 is a circuit diagram 20 of a polarization switching digital to analog converter in accordance with one embodiment of the invention. This figure shows the converter 20 converting the digital signal positive number "10 . . . 0" into an analog voltage. The reset switch 38 is open. Since the number has one in the most significant number the switches 49 & 60 are now closed around the capacitor C1. As a result, the positive voltage source 27 is applied to node 99. This is going to cause the polarization of capacitor C1 to switch and places the capacitor in position bi=1 as shown in graph 90. This causes a switching current ($i_s$) and displacement current ($i_d$) 91 (Shown in dashed lines) to flow into the linear capacitor 36. The switches for the other capacitive legs do not change, so there is not output current. The current is integrated by the capacitor 36 an operational amplifier 34 to create the analog output 40 level.

Figure 5:
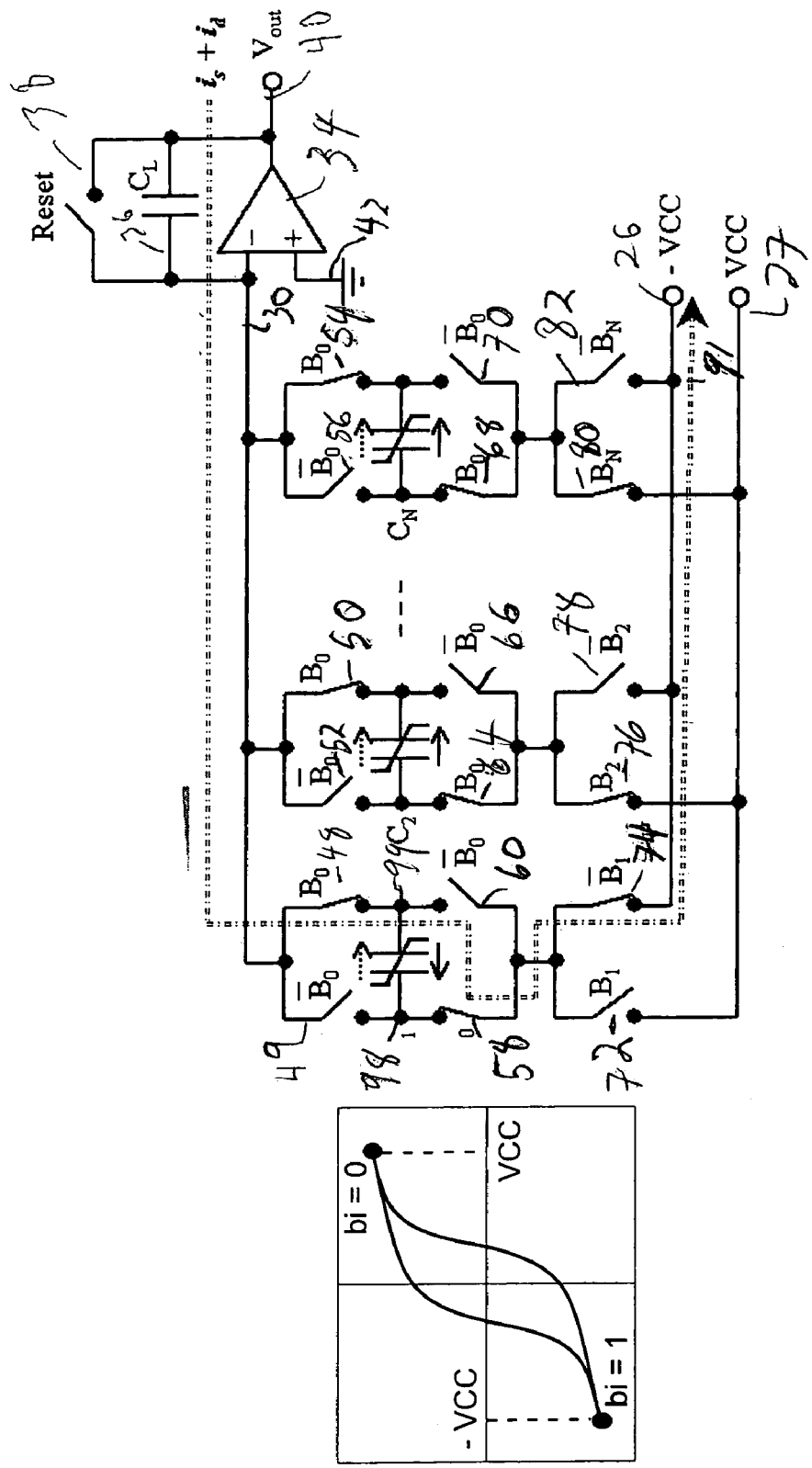
FIG. 5 is a circuit diagram of a polarization switching digital to analog converter in accordance with one embodiment of the invention.

FIG. 5 is a circuit diagram of a polarization switching digital to analog converter 20 in accordance with one embodiment of the invention. In this example it is assumed that input number is a negative "10 . . . 0". The switches associated with capacitors C2 and Cn do not change from the reset state. However, the switch 72 is opened and switch 74 is closed. These switches are associated with capacitor C1. This results in a negative voltage source 26 being applied to node 98 instead of a positive voltage. As a result, the switching current ($i_s$) and displacement current ($i_d$) 91 flowing from the output 30 to the negative voltage source 26. This current is summed by the capacitor 36, which results in the negative analog voltage at the output 40. Note that it is necessary to take both the switching current and the displacement current into account when sizing the ferroelectric capacitors.

Figure 6:
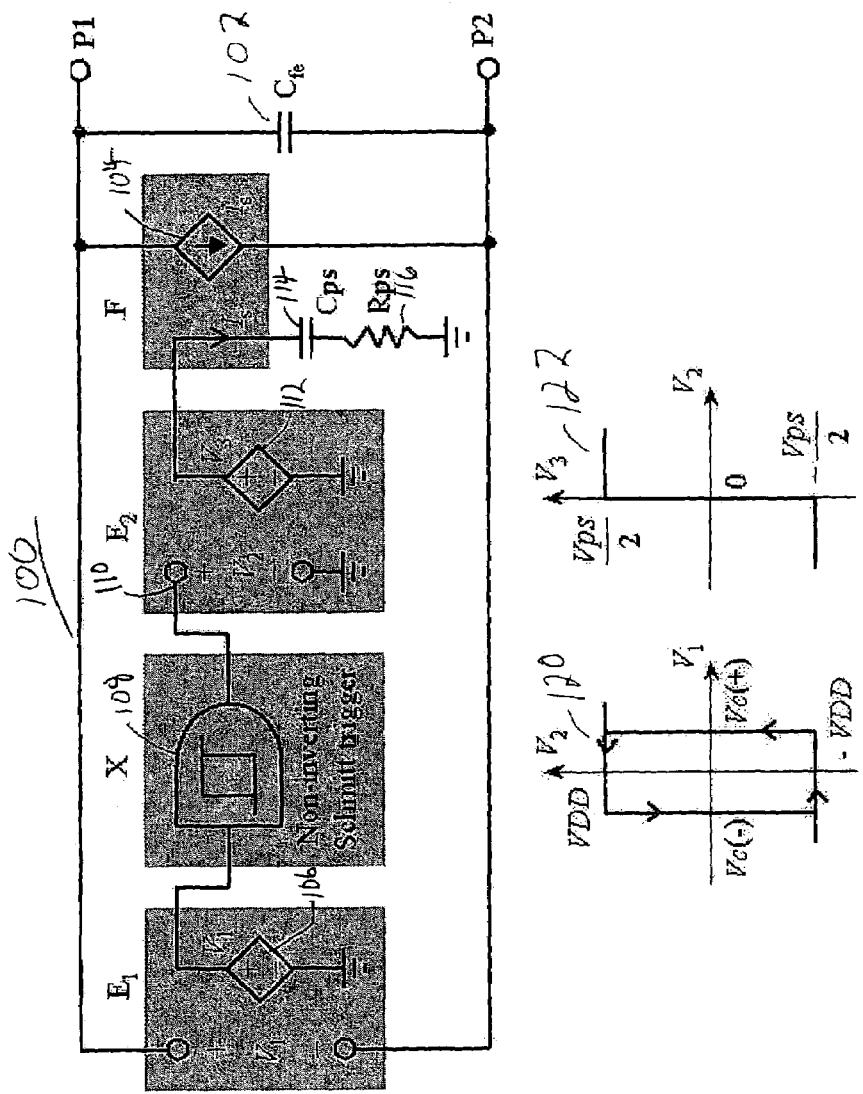
FIG. 6 is an ideal circuit model for computer simulation of a ferroelectric capacitor in accordance with one embodiment of the invention.

FIG. 6 is an ideal circuit model 100 for computer simulation of a ferroelectric capacitor in accordance with one embodiment of the invention. This circuit model 100 is composed of a capacitor Cfe 102 in parallel with a current source F 104. The capacitor Cfe 102 reflects the non-switching charge originating from the displacement current of a ferroelectric capacitor. The current-controlled current source F 104 produces an exponential decay current that accommodates a total switching-charge. The voltage drop across the capacitor and its history determines whether polarization reversal takes place. Here, the voltage-controlled voltage source E1 106 detects the voltage across the capacitor and the non-inverting Schmitt trigger 108 mimics the hysteresis characteristics. The output 110 of the Schmitt trigger 108 is reshaped by the voltage-controlled voltage source E2 112. An ideal step-voltage output of E2 112 drives the simple RC circuit 114, 116, which ensures the generation of the controlling current with exponential decay characteristics. Note that the graphical representation of the output of the Schmitt trigger 108 is shown in graph 120 and the operation of the voltage-controlled voltage source E2 112 is shown in graph 122.

Thus there has been described a polarization switching digital to analog converter that does not require a significant amount of die space, does not draw significant current and can store its output.

The methods described herein can be implemented as computer-readable instructions stored on a computer-readable storage medium that when executed by a computer will perform the methods described herein.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A polarization switching digital to analog converter, comprising:
   a ferroelectric capacitor;
   a plurality of switches coupled to the ferroelectric capacitor wherein the plurality of switches include a first switch connecting a first terminal of the ferroelectric capacitor to the summing network and a second switch connecting a second terminal of the ferroelectric capacitor to the summing network; and a summing circuit coupled to the one of the plurality of switches.

2. The polarization switching digital to analog converter of claim further including a plurality of ferroelectric capacitors each of the capacitors forming a leg of the digital to analog converter.

3. The polarization switching digital to analog converter of claim 1, wherein the plurality of switches include a subset of switches connecting the first terminal to a positive voltage source and a negative voltage source.

4. The polarization switching digital to analog converter of claim 3, wherein the plurality of switches include a second subset of switches connecting the second terminal to the positive voltage source and the negative voltage source.

5. The polarization switching digital to analog converter of claim 1, wherein the ferroelectric capacitor is operated in a non-linear region.

6. The polarization switching digital to analog converter of claim 1, wherein the summing circuit has a feedback capacitor and the feedback capacitor is a linear capacitor.

7. A method of operating a polarization switching digital to analog converter, comprising the steps of:
    a) applying a reset signal to a plurality of non-linear capacitors;
    b) applying a digital number to a plurality of switches coupled to the plurality of non-linear capacitors; and
    c) summing a current from the plurality of capacitors.

8. The method of claim 7, wherein step (a) further includes the step of:
    a1) setting an initial polarization for each of the plurality of non-linear capacitors.

9. The method of claim 8, further including the step of:
    a2) setting the initial polarization of each of the plurality of non-linear capacitors to have a same polarization.

10. The method of claim 7, wherein step (a) further includes the step of:
    a1) selecting each of the plurality of non-linear capacitors based on a switching current and a displacement current.

11. The method of claim 7, wherein step (b) further includes the steps of:
    b1) determining for each non-linear capacitor if a one or a zero is to be represented;
    b2) when the one is to be represented reversing a polarity of an associated non-linear capacitor.

12. The method of claim 7, wherein step (a) further includes the step of:
    a1) selecting a plurality of ferroelectric capacitors.

13. The method of claim 12, further including the step of:
    a2) selecting an operating voltage that results in the plurality of ferroelectric capacitors operating in a non-linear range.

14. A polarization switching digital to analog converter, comprising:
    a plurality of non-linear capacitive legs wherein the plurality of non-linear capacitive legs each contain a ferroelectric capacitor;
    a summing circuit coupled to an output of the plurality of non-linear capacitive legs.

15. The polarization switching digital to analog converter of claim 14, wherein the plurality of non-linear capacitive legs have a pair of switches connecting each non-linear capacitor to the output of the plurality of non-linear capacitive legs.

16. The polarization switching digital to analog converter of claim 15, wherein each non-linear capacitor is coupled to a positive power supply source by a pair of switches.

17. The polarization switching digital to analog converter of claim 15, wherein each non-linear capacitor is coupled to a negative power supply source by a pair of switches.

18. The polarization switching digital to analog converter of claim 14, wherein the summing circuit includes a linear capacitor.

19. An ideal circuit model for computer modeling of a ferroelectric capacitor, comprising:
    a Schmitt trigger having an input coupled to a first voltage controlled voltage source;
    a RC circuit coupled to an output of the Schmitt trigger;
    a current controlled current source controlled by a current of the RC circuit; and
    a polarization capacitor in parallel with the current controlled current source.

20. The ideal circuit model of claim 19, further including a second voltage controlled voltage source controlled by an output voltage of the Schmitt trigger.

21. The ideal circuit model of claim 20, wherein the Schmitt trigger is non-inverting.

22. The ideal circuit model of claim 21, wherein the voltage controlled voltage source has a binary output.

* * * * *